(12) United States Patent
Harikai et al.

(10) Patent No.: US 10,763,124 B2
(45) Date of Patent: Sep. 1, 2020

(54) MANUFACTURING PROCESS OF ELEMENT CHIP

(71) Applicant: Panasonic Intellectual Property Management Co., Ltd., Osaka (JP)

(72) Inventors: Atsushi Harikai, Osaka (JP); Noriyuki Matsubara, Osaka (JP); Shogo Okita, Hyogo (JP); Hidehiko Karasaki, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/194,547

(22) Filed: Nov. 19, 2018

(65) Prior Publication Data
US 2019/0157100 A1    May 23, 2019

(30) Foreign Application Priority Data
Nov. 22, 2017   (JP) .................. 2017-224931

(51) Int. Cl.
*H01L 21/20*       (2006.01)
*H01L 21/306*      (2006.01)
(Continued)

(52) U.S. Cl.
CPC ........ *H01L 21/31144* (2013.01); *H01J 37/00* (2013.01); *H01L 21/02118* (2013.01);
(Continued)

(58) Field of Classification Search
CPC ............... H01L 21/78; H01L 21/02057; H01L 21/3081; B23K 26/359; B23K 26/364;
(Continued)

(56) References Cited

U.S. PATENT DOCUMENTS 5,248,384 A * 9/1993 Lin ....................... H01L 21/321
                                                              216/102
5,744,402 A * 4/1998 Fukazawa ......... H01L 21/02071
                                                              438/706
(Continued)

FOREIGN PATENT DOCUMENTS

JP     2014-523112 A    9/2014

*Primary Examiner* — Brian Turner
(74) *Attorney, Agent, or Firm* — Pearne & Gordon LLP

(57) ABSTRACT

A manufacturing process of an element chip comprises steps of preparing a substrate including a plurality of dicing regions and element regions each containing a plurality of convex and concave portions, holding the substrate and a frame with a holding sheet, forming a protective film by applying a first mixture to form a coated film above the substrate and by drying the coated film to form the protective film along the convex and concave portions, the first mixture containing a first resin and an organic solvent having a vapor pressure higher than water, removing the protective film by irradiating a laser beam thereon to expose the substrate in the dicing regions, plasma-etching the substrate along the dicing regions while maintaining the protective film in the element regions to individualize the substrate, and removing the protective film by contacting the protective film with an aqueous rinse solution.

18 Claims, 7 Drawing Sheets

(51) Int. Cl.
  *G03F 7/038* (2006.01)
  *G03F 7/40* (2006.01)
  *H01L 21/78* (2006.01)
  *H01L 29/06* (2006.01)
  *H01L 21/311* (2006.01)
  *H01L 23/00* (2006.01)
  *H01L 21/67* (2006.01)
  *H01L 21/3065* (2006.01)
  *H01L 21/82* (2006.01)
  *H01L 21/3213* (2006.01)
  *H01L 21/02* (2006.01)
  *H01L 21/308* (2006.01)
  *H01L 21/683* (2006.01)
  *H01J 37/00* (2006.01)

(52) U.S. Cl.
  CPC .... *H01L 21/02282* (2013.01); *H01L 21/3081* (2013.01); *H01L 21/30655* (2013.01); *H01L 21/31138* (2013.01); *H01L 21/32137* (2013.01); *H01L 21/67069* (2013.01); *H01L 21/6836* (2013.01); *H01L 21/78* (2013.01); *H01L 21/82* (2013.01); *H01L 24/14* (2013.01); *H01L 24/11* (2013.01); *H01L 24/13* (2013.01); *H01L 2221/68327* (2013.01); *H01L 2224/11001* (2013.01); *H01L 2224/1301* (2013.01); *H01L 2224/13101* (2013.01); *H01L 2224/13124* (2013.01); *H01L 2224/13139* (2013.01); *H01L 2224/13144* (2013.01); *H01L 2224/13147* (2013.01)

(58) Field of Classification Search
  CPC  B23K 26/064; B23K 26/355; B23K 26/0006; B23K 26/402; B23K 26/0624
  See application file for complete search history.

(56) References Cited

U.S. PATENT DOCUMENTS

| | | | |
|---|---|---|---|
| 6,291,339 B1* | 9/2001 | Avanzino | H01L 21/76819 257/E21.576 |
| 8,703,581 B2 | 4/2014 | Lei et al. | |
| 2007/0042604 A1* | 2/2007 | Ahn | C08F 220/18 438/689 |
| 2007/0059644 A1* | 3/2007 | Takahashi | G03F 7/40 430/311 |
| 2008/0044769 A1* | 2/2008 | Kozawa | G03F 7/40 430/311 |
| 2011/0223753 A1* | 9/2011 | Wang | H01L 21/28017 438/585 |
| 2014/0057414 A1* | 2/2014 | Iyer | H01L 21/78 438/463 |
| 2015/0116684 A1* | 4/2015 | Suzuki | G02B 26/0841 355/67 |
| 2016/0291464 A1* | 10/2016 | Kawamura | G03F 7/0397 |
| 2018/0345418 A1* | 12/2018 | Lei | H01L 21/6836 |

* cited by examiner

MANUFACTURING PROCESS OF ELEMENT CHIP

CROSS REFERENCE TO RELATED APPLICATION

The present application is based on and claims priority under 35 U.S.C. § 119 with respect to the Japanese Patent Application No. 2017-224931 filed on Nov. 22, 2017, of which entire content is incorporated herein by reference into the present application.

TECHNICAL FIELD

The present invention relates to a manufacturing process of an element chip produced by plasma-etching a substrate including a plurality of element regions, each of which contains an asperity caused by as an electrical circuitry and a bump thereon.

BACKGROUND

Before individualizing (dicing) the substrate into a plurality of element chips by a plasma-etching technique, a protective mask (a protective film) is formed to protect the elements regions. Although a resist film is typically used for the mask, a coated film of water-soluble resin may be used as described in Patent Document 1 (JP 2014-523112 A or U.S. Pat. No. 8,703,581 B2). When the coated film of water-soluble resin is used as the mask, it is advantageously removed by flushing it with water in an efficient manner.

In the meanwhile, the substrate contains a surface of high water-repellency and the element regions in which exposed electrodes and bumps are arranged forming the fine asperity thereon. When the water-soluble resin solution is applied on such a bumpy surface to form a coated film, the water-soluble resin solution may fail to cover the whole surface without reaching to the portions close to the fine asperity, and the water-soluble resin solution may flow on the surface before it is fully dried to form the protective film due to less volatility of water. As such it is difficult to apply the coated film across the bumps on the substrate surface. When the protective film is deficiently formed across the bumps, the substrate in the element regions may be adhered with debris caused in a laser grooving step of the protective film along the dicing regions that define the element regions, and may be damaged by a plasma exposure in a plasma-etching step thereof. Thus, the present disclosure suggests applying the water-soluble resin solution in every corner across the bumpy surface, so that the coated film is formed to cover the whole surface in a uniform manner regardless the asperity thereof.

In order to form the coated film on the substrate surface in a more uniform manner, it is desirable to quickly remove or dry the volatile components in the water solution. The substrate may be heated to accelerate removing or drying the volatile components of the resin solution. However, while the substrate is processed with a holding sheet such as a dicing tape adhered thereon, since the holding sheet has a heatproof temperature of 80 degrees C. or less (mostly 60 degrees C. or less) and a poor thermostability, the holding sheet cannot be heated to the temperature sufficiently to remove or dry the volatile components of the water solution. If the coated film is dried insufficiently, a mask burning or a mask deformation may be caused in the laser grooving step and the plasma-etching step.

SUMMARY

One aspect of the present invention relates to a manufacturing process of an element chip, which comprises a preparing step for preparing a substrate having first and second sides opposed to each other, and including a plurality of dicing regions and element regions defined by the dicing regions, each of the element regions containing a plurality of convex and/or concave portions formed above the first side of the substrate, a holding step for holding the substrate and an annular frame surrounding the substrate with a holding sheet adhered on the second side of the substrate, a protective-film forming step for forming a protective film by applying a first mixture to form a coated film above the first side of the substrate and by drying the coated film to form the protective film along the convex and/or concave portions, the first mixture containing a first resin and an organic solvent having a vapor pressure higher than water, a laser grooving step for removing the protective film along the dicing regions by irradiating a laser beam onto the protective film covering the dicing regions thereby to expose the first side of the substrate in the dicing regions, a dicing step for plasma-etching the substrate from the first side through the second side along the dicing regions while maintaining the protective film in the element regions thereby to dice the substrate into a plurality of element chips, and a removing step for removing the protective film in the element regions by contacting the protective film with an aqueous rinse solution.

Another aspect of the present invention relates to a manufacturing process of an element chip, which comprises a preparing step for preparing a substrate including a plurality of dicing regions and element regions defined by the dicing regions, each of the element regions containing an asperity thereon, a protective-film forming step for forming a protective film by applying a first mixture to the substrate to form a coated film and by drying the coated film to form the protective film, the first mixture containing a first resin and an organic solvent having a vapor pressure higher than water, a laser grooving step for removing the protective film along the dicing regions by irradiating a laser beam onto the protective film along the dicing regions thereby to expose the substrate, a dicing step for plasma-etching the substrate with the protective film used as a mask to dice the substrate into a plurality of element chips, and a removing step for removing the protective film with an aqueous rinse solution.

DETAILED DESCRIPTION

Figure 1:
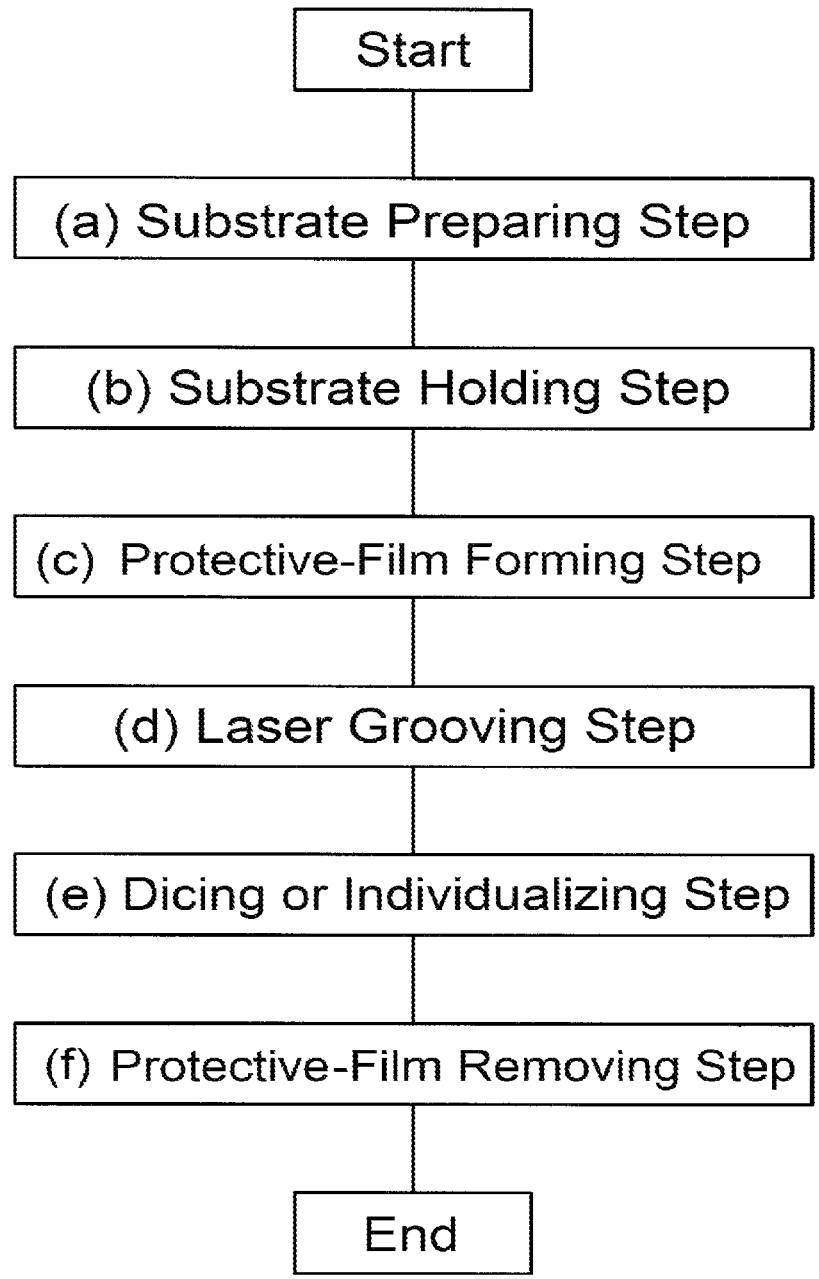
FIG. 1 is a flowchart illustrating a manufacturing process of an element chip according to an embodiment of the present invention.

With reference to attached drawings, a manufacturing process of an element chip according to an embodiment of the present invention will be described hereinafter. In the description, a couple of terms for indicating the directions (for example, "upper" and "vertical") are conveniently used just for facilitating clear understandings, it should not be interpreted that those terms limit the scope of the present invention. Also, in the drawings, each component of the element chip is illustrated in a relative manner in size for clarifying the shape and the feature thereof, and not necessary in the exact scale.

The manufacturing process of the element chip according to an embodiment of the present invention comprises, as shown in a flowchart of FIG. 1, (a) a substrate preparing step for preparing a substrate including a plurality of dicing regions and element regions defined by the dicing regions, (b) a substrate holding step for holding the substrate and an annular frame with a holding sheet adhered thereon, (c) a protective-film forming step for forming a protective film by applying a first mixture to form a coated film and by drying the coated film to form the protective film, (d) a laser grooving step for removing the protective film along the dicing regions by irradiating a laser beam thereon, (e) a dicing or individualizing step for plasma-etching the substrate from the first side through the second side along the dicing regions thereby to dice the substrate into a plurality of element chips; and (f) a protective-film removing step for removing the protective film.

(a) Substrate Preparing Step: A substrate is prepared in the substrate preparing step, which is eventually individualized or diced into a plurality of element chips by a plasma etching technique. The substrate may be formed of a semiconductor substrate such as a silicon wafer, a resin board such as a flexible printed circuit board, or a ceramics substrate, for example. Also, the semiconductor substrate may be made of silicon (Si), gallium arsenide (GaAs), gallium nitride (GaN), or silicon carbide (SiC), for example. The present invention is not limited to a particular material of the substrate.

Figures 2A, 2B, 2C:
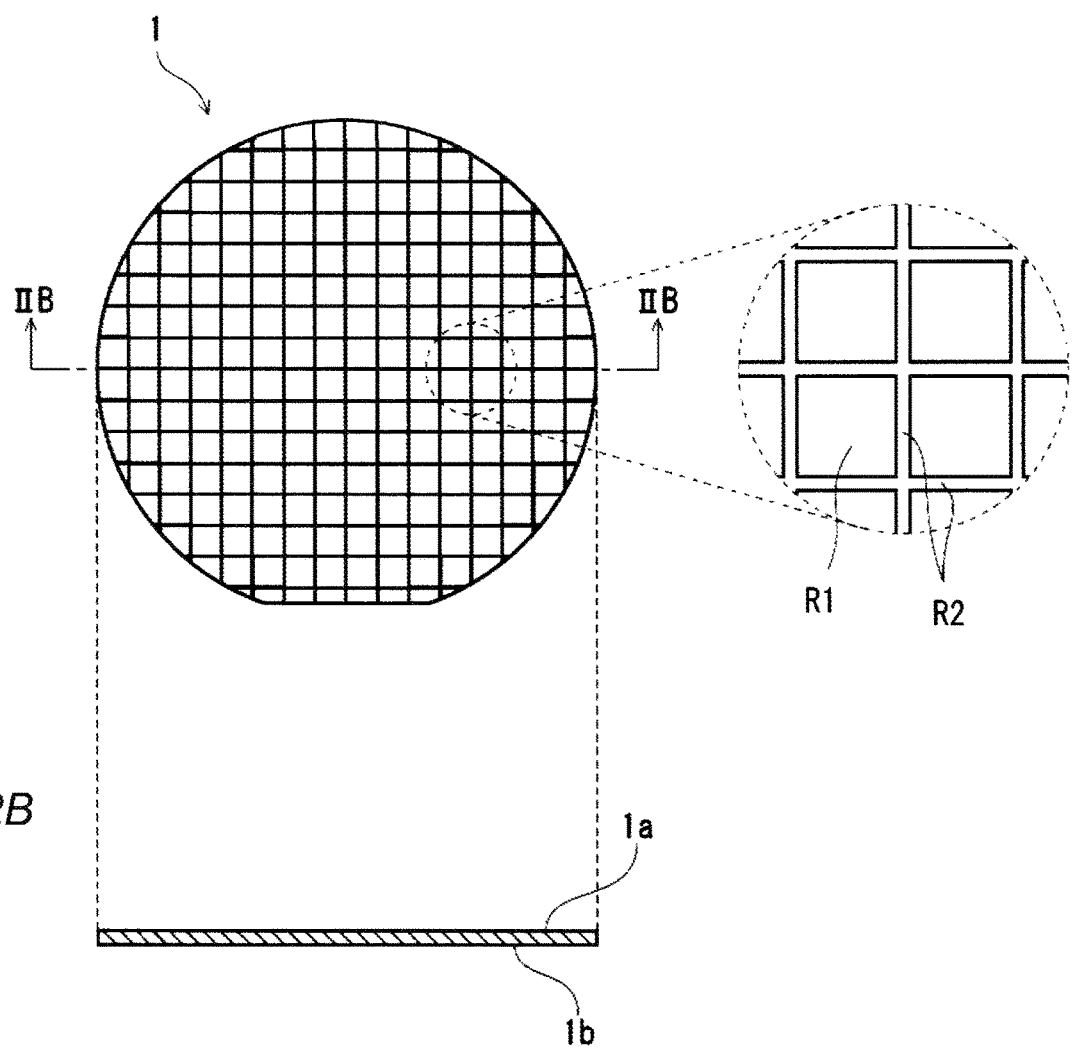
FIG. 2A is a top plan view of a substrate.
FIG. 2B is a cross-sectional view taken along a line IIB-IIB of FIG. 2A.
FIG. 2C is a partially enlarged view of FIG. 2A.

FIG. 2A is a top plan view of a substrate, FIG. 2B is a cross-sectional view taken along a line IIB-IIB of FIG. 2A, and FIG. 2C is a partially enlarged view of FIG. 2A, which schematically illustrate the substrate 1. As shown in FIG. 2B, the substrate 1 has a first side 1a and the second side 1b opposed to each other, which are referred to as a top side 1a and bottom side 1b, respectively. Also, as shown in FIG. 2C, the substrate 1 includes a plurality of the element regions R1 and the dicing regions R2 defining each of the element regions R1 on the top side 1a of the substrate 1. In each of the element regions R1, the substrate 1 contains an integrated circuitry composing a desired electric circuitry, which forms the element chip after the plasma etching step as will be described hereinafter, and each of the dicing regions R2 of the substrate 1 is used as dicing lines, along which the substrate 1 is diced.

Figure 3:
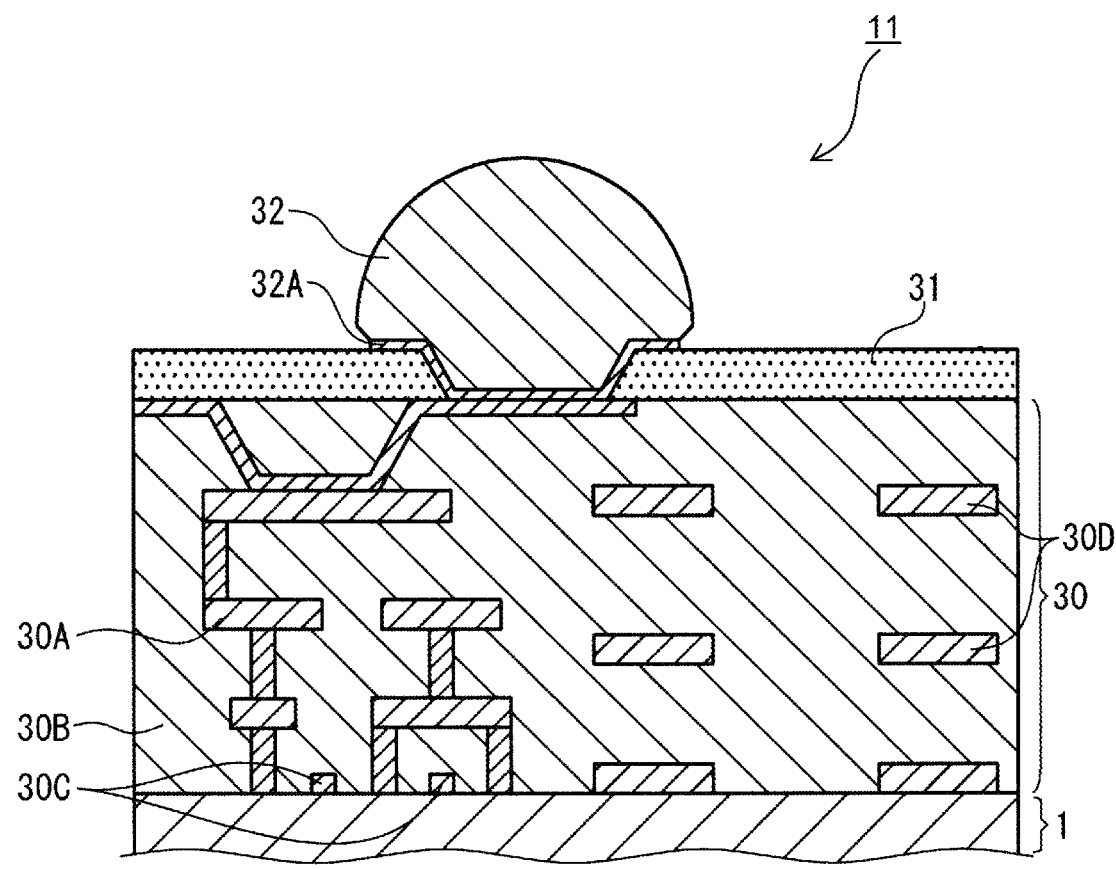
FIG. 3 is an enlarged cross-sectional view illustrating a portion of the element chip.

FIG. 3 is an enlarged cross-sectional view of the element chip 11, which includes the substrate 1 (semiconductor layer), a multi-stacked wiring layer 30 containing a plurality of stacked wiring layers, a protecting layer 31 on the multi-stacked wiring layer 30, and a bump 32 on the protecting layer 31 used as an electrode. Formed between the protecting layer 31 and the bump 32 of the element chip 11 is a UBM layer 32A (under bump metal layer). The UBM layer 32A is the under layer of the bump 32, which is typically made of conducting material to electrically connect with metal wiring layers 30A in the multi-stacked wiring layer 30. The multi-stacked wiring layer 30 contains the metal wiring layers 30A, insulating layers 30B, and transistor elements 30C. Also, the multi-stacked wiring layer 30 contains another metal wiring layers 30D named as a TEG (Test Element Group).

As described above, the element chip 11 includes the integrated circuitry and the bump 32 in the element regions R1, which causes an asperity (convex and/or concave surfaces) above the top side 1a of the substrate 1.

Typically, the bump 32 is made of solder, which may be formed by a plating, printing, or vapor depositing technique. The bump 32 also contains metal such as Cu, Cu—Sn—Ag alloy, Ag—Sn alloy, Au, Al, or Al alloy. Although not limited thereto, the shape of the bump 32 may be a hemisphere, a prism, a column, a pyramid, or a ball. Also, although not limited thereto, the arrangement and numbers of the bump 32 may be selected in accordance with the application of the element chip 11. Instead of the bump 32 in a convex configuration, a concave pad electrode acting as the electrode may be applied. Also, the bump 32 may be made of Cu and shaped in a pillar having a diameter of 40 μm and a height of 50 μm.

The multi-stacked wiring layer 30 may include the wiring layer having a thickness of approximately 5 μm, for example, which contains a low-k (low-dielectric) material and a Cu wiring layer. Also, the substrate 1 may be a silicon (Si) semiconductor layer having an insulating layer of $SiO_2$ having a thickness of approximately 1 for example.

The wiring layer 30A may be made of metal such as Cu, Al, Al alloy, and W. The insulating layer 30B may be made of material including, for example, $SiO_2$, SiN, SiOC, or low-k material. Any well-known material may be used for of the transistor element 30C. The metal layers 30D may be made of metal such as Cu, Al, Al alloy, and W.

The electric circuitry on the top side 1a in each of the element regions R1 may contain a circuit layer including a semiconductor circuitry, an electronic component, and/or MEMS, but not limited thereto. The circuit layer may be structured as a multi-layered stack containing an insulating layer, a conducting layer, a resin protecting layer, an electrode pad, and an electric terminal. The bump 32 is connected to the electric terminal of the multi-layered stack 30.

After forming the multi-layered stack 30, in order to thin the substrate 1, it may be ground on the bottom side 1b thereof. More specifically, after a back-grinding (BG) tape may be used to cover and protect the top side 1a of the substrate 1, it is ground on the bottom side 1b thereof.

Figure 4A:
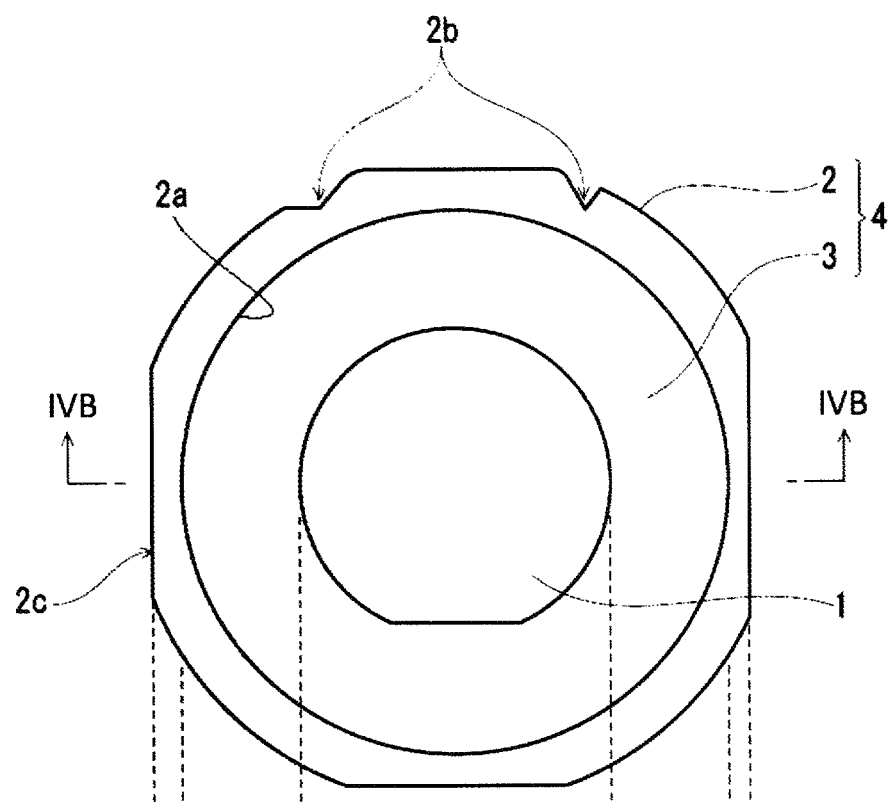
FIG. 4A is a top plan view of a conveying carrier with the substrate adhered thereon.

The substrate 1 may have any planar shape, and for example, in a substantially circle as shown in FIG. 4A, or a rectangle (not shown). Besides, the substrate 1 may have a cut-out such as an orientation flat (FIG. 4A) and a notch. Although not limited thereto, the substrate 1 may have the maximum diameter in a range between 50 mm and 300 mm and a thickness in a range between 10 μm and 800 μm.

Figure 4B:
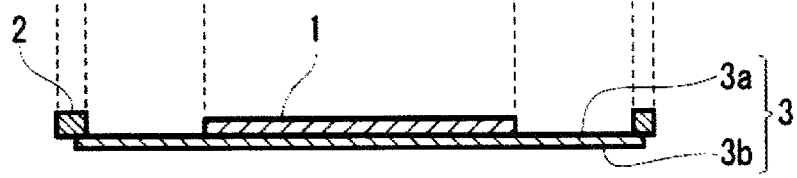
FIG. 4B is a cross-sectional view taken along a line IVB-IVB of FIG. 4A.

(b) Substrate Holding Step: FIG. 4A is a top plan view of a conveying carrier which includes a holding sheet 3 adhering the substrate 1 and an annular frame 2 thereon, and FIG. 4B is a cross-sectional view taken along a line IVB-IVB of FIG. 4A. Thus, the substrate 1 and the annular frame 2 are held on the holding sheet 3, during forming any desired electric circuitry and at least prior to the protective-film forming step as will be described hereinafter. The holding sheet 3 includes an upper side 3a (an adhesive side) having an adhesive thereon and a lower side 3b (a non-adhesive side 3b) having no adhesive thereon. The holding sheet 3 holds the bottom side 1b of substrate 1 and the annular frame 2 by adhering them on the adhesive side 3a thereof. The annular frame 2 having a circular opening 2a is adhered on the holding sheet 3, and the substrate 1 is adhered and arranged concentrically with the circular opening 2a of the frame 2. The adhesive side 3a is exposed in the opening 2a which is not covered by the substrate 1. In the present disclosure, a combination of the holding sheet 3 and the frame 2 adhered thereon may be referred to as a conveying carrier, and substrate 1 adhered on the conveying carrier 4 may be referred to as an on-carrier substrate 1. Even if the substrate 1 itself is thin, since it is held on the conveying carrier 4, the substrate 1 can readily be manipulated in and delivered through the steps of the manufacturing process.

The holding sheet 3 has a base member (a backing member) made of a thermoplastic resin including, for example, polyethylene, polyolefin such as polypropylene, and polyester such as polyethylene terephthalate. Also, the holding sheet 3 may be designed to have a stretching property allowing it being removed from the frame 2 and being spread in a radial direction to expand a gap between the adjacent element chips after the protective-film forming step described below, thereby to facilitate peeling off and picking up each of the element chips from the adhesive side 3a thereof. In order to add the stretching property, the base member of the holding sheet 3 may contain various additives including, for example, a rubber component for adding the stretching property (for example, ethylene-propylene rubber (EPM), ethylene-propylene-diene rubber (EPDM)), a plasticizer, a softener, an antioxidant, and a conductive material. The thermoplastic resin may contain a functional group showing a photopolymerization reaction such as an acryl group. Although not limited thereto, the base member may have a thickness in a range between 50 µm and 150 µm, for example.

The adhesive side 3a of the holding sheet 3 preferably contains an adhesive material of which adhesibility is weakened with an ultra-violet beam (UV-radiation). This allows each of the individualized element chips obtained after the plasma dicing step to easily be peeled off and picked up from the adhesive side 3a with the UV-radiation. The holding sheet 3 may be formed, for example, by applying an UV-curing acrylic adhesive on the adhesive side 3a of a film-shaped base member to have a thickness in a range between 5 and 20 µm.

The frame 2 has such a rigidity that it can be transferred or delivered with the holding sheet 3 and the substrate 1 adhered thereon. Besides the circular shape, the opening 2a of the frame 2 may be formed in a polygonal shape (such as rectangular and hexagonal). As shown in FIG. 4A, the frame 2 may be provided with a notch 2b and/or a corner cut 2c for alignment thereof. Also, the frame 2 may be formed of, for example, a metal such as aluminum and stainless steel, or a resin.

(c) Protective-Film Forming Step: In a protective-film forming step, a first mixture containing a first water-soluble resin and an organic solvent is applied to a top side 1a of the substrate 1 so as to form a coated film 28a. Then, the coated film 28a is dried to form a protecting layer 28 containing the first resin.

Figure 5A:
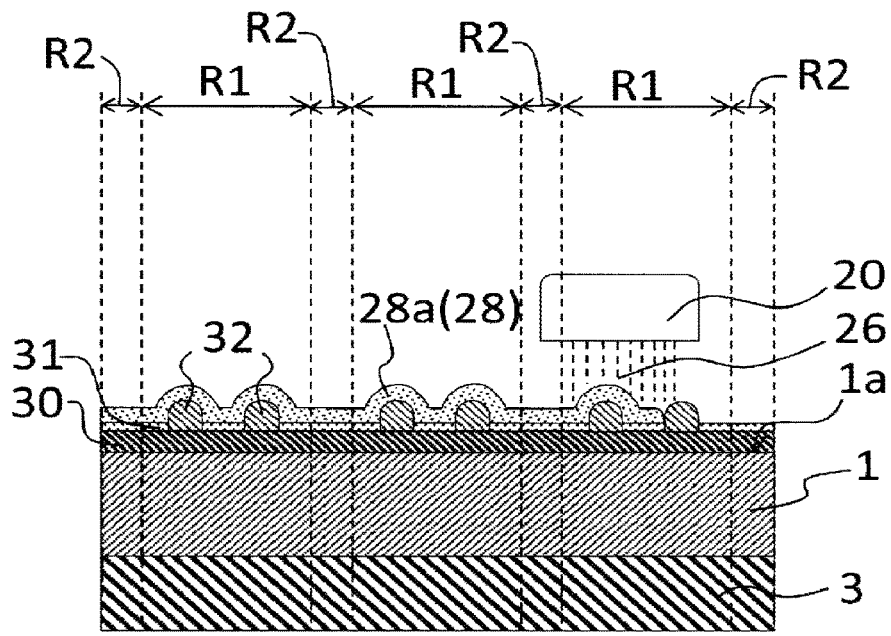
FIG. 5A is a schematic cross-sectional view illustrating a coated film formed by applying a first mixture containing a first resin and an organic solvent in a protective-film forming step of a manufacturing process according to an embodiment of the present invention.
Figure 5B:
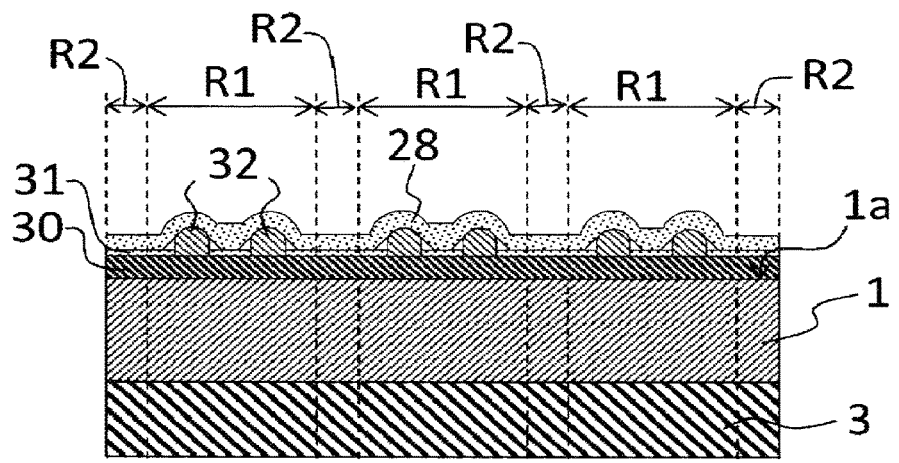
FIG. 5B is a schematic cross-sectional view illustrating another coated film formed by applying an aqueous solution containing the first resin according to a conventional manufacturing process.

FIG. 5A is a schematic cross-sectional view illustrating the coated film 28a formed by applying the first mixture containing the first resin and the organic solvent in the protective-film forming step of a manufacturing process according to the embodiment of the present invention, and FIG. 5B is a schematic cross-sectional view illustrating another coated film formed by applying the aqueous solution containing the first resin according to a conventional manufacturing process. The substrate 1 of the embodiment shown in FIGS. 5A and 5B includes a plurality of projecting bumps 32 in the element regions R1 over the top side 1a. Although the structure of a circuit layer is not specifically limited, the depicted structure includes the multi-stacked wiring layer 30, an insulative protecting layer 31, and the projecting bumps 32 each connected to terminal members on the multi-stacked wiring layer 30. Although the arrangement of the multi-stacked wiring layer 30 is not specifically limited, it may be formed both in the element regions R1 and the dicing regions R2 as shown in FIGS. 5A and 5B, or only in the element regions R1.

The projecting bumps 32 as well as the multi-stacked wiring layer 30 and the insulative protecting layer 31 form the convex portions on the top side 1a of the substrate 1. Also, they form the concave portions between adjacent bumps 32 and/or between the bump 32 and the adjacent multi-stacked wiring layer 30 (insulative protecting layer 31). Typically as described above, the insulative protecting layer 31 of material such as polyimide, polybenzoxazole (PBO), and silicon nitride is formed on the top side of the substrate 1 in the element regions R1 and the dicing regions R2, which has a high water-repellent property.

In FIG. 5B, when the aqueous solution containing the first resin is applied onto the surface of the insulative protecting layer 31 and the bumps 32, the solution may fail to cover the concave portions (close to the roots of the bumps) and/or the convex portions due to a high surface tension of water and/or the high water-repellent property of the insulative protecting layer 31. Also, as the solvent (water) needs some time for vaporization, the aqueous solution likely runs on the insulative protecting layer 31 while being dried. This makes difficult to evenly form the coated film 28a on the surfaces of the insulative protecting layer 31 and the bumps 32 along the concave portions and the convex portions, which in turn causes the (dried) protective film 28 cover the surface of the multi-stacked wiring layer 30 insufficiently. Thus, the protecting layer 31 may have a pin-hole or a depression thereon, and the protective film 28 may partially be lost during the subsequent plasma-etching step, causing the top side 1a of the substrate 1 exposed to the plasma atmosphere. Also, when insufficiently covered by the protecting layer 31, the multi-stacked wiring layer 30 in the element regions R1 may be subjected to debris generated during the subsequent laser grooving step for removing the protecting layer 31, and/or may be damaged in the element regions R1 by the plasma exposure during the dicing the substrate 1 by the plasma-etching step. In addition, bubbles or voids may be defined in areas where the aqueous solution uncovers the insulative protecting layer 31 or the bumps 32 as depicted in FIG. 5B. The voids may inflate and burst in the plasma-etching step, which deteriorates a reliability of the element chips. Furthermore, since the holding sheet 3 holding the substrate 1 has a poor heat resistance, a special caution is required to heat the conveying carrier 4 including the holding sheet 3 up to a temperature which facilitates to dry the water-soluble coated film 28*a*. On the other hand, when the coated film 28*a* is less adequately dried, a mask burning or a mask deformation may be caused in the laser grooving step and/or the dicing step.

On the contrary, according to the present invention, the coated film 28*a* is formed by applying or spraying a first mixture 26 containing the first resin and the organic solvent having a vapor pressure higher than water onto the surfaces of the insulative protecting layer 31 and the bumps 32 both in the element regions R1 and dicing regions R2 so as to form the coated film 28*a*. Such an organic solvent has a relatively low surface tension and viscosity, which allows the first mixture 26 fully covering the concave portions and/or the convex portions on the bumps 32 and the insulative protecting layer 31 as depicted in FIG. 5A. The organic solvent has the vapor pressure higher than water, which facilitates vaporization of the organic solvent of the first mixture 26 at relatively low temperature even while being applied or sprayed, thereby to suppress the first mixture 26 running on the bumps 32 and the insulative protecting layer 31. This also facilitates to apply the coated film 28*a* along the irregular contours of the concave portions and/or the convex portions on the bumps 32 and the insulative protecting layer 31 so as to fully cover them after being dried. As such, in the protective-film forming step according to the present embodiment, the circuit layer is provided on the top side 1*a* of the substrate 1, and even if the bumps 32 and the insulative protecting layer 31 have the irregular surfaces, the protecting or coated film 28*a* can fully cover the uneven surfaces. This minimizes the damage to the multi-stacked wiring layer 30 due to the debris adhered in the element regions R1 during the laser grooving step and the plasma exposure during the individualizing or dicing step. Also, the organic solvent that vaporizes at lower temperature is used to reliably dry the coated film 28*a* at the reduced temperature. In addition, the present embodiment reduces the thermal damages on the dicing tape or holding sheet 3, which in turn suppresses the in-process defects due to the damaged dicing tape 3. Furthermore, the mask burning and/or the mask deformation can be minimized in the laser grooving step and the individualizing step.

In FIG. 5A, although a spray-coating apparatus is used for spraying the first mixture 26 from a nozzle 20 thereof, it is not limited thereto, any other type of the coating apparatus such as a spin-coating apparatus may be used. Also, the spray-coating and the spin-coating techniques may be combined for coating the first mixture 26. The spray-coating apparatus allows the coated film 28*a* to be formed in a uniform manner, and also facilitates the organic solvent in the spayed first mixture 26 to be vaporized even before the droplets thereof reach onto the substrate 1, thereby to further prevent the coated film 28*a* from flowing thereon. This helps formation of the protective film 28 along the convex and/or concave portions on the insulative protecting layer 31 and the bumps 32. Therefore, it is preferable to use at least the spray-coating step for applying the first mixture 26. Also, when the spray-coating process is combined with the spin-coating process, preferably the spin-coating process is achieved after the spray-coating process. When the spin-coating process is achieved after the spray-coating process, the thinner coated film 28*a* is formed the spray-coating process along the concave portions and/or the convex portions on the bumps 32 and the insulative protecting layer 31, and then the thicker coated film 28*a* can readily be formed by the spin-coating process so that any desired thickness of the coated film 28 can be achieved.

The spray-coating apparatus may be an inkjet type, an ultrasonic type, and an electrostatic type. The inkjet type and the ultrasonic type of the spray-coating apparatus is configured to form droplets of the first mixture 26 by means of a heater, a piezoelectric element, and an ultrasonic oscillator and to inject the formed droplets onto the top surface 1*a* of the substrate 1 for deposition thereof. The electrostatic type of the spray-coating apparatus is configured to electrically charge the first mixture 26 and to spray them onto the top surface 1*a* of the substrate 1 which is of the opposite polarity. The spin-coating apparatus is configured to put drops of the first mixture 26 onto the substrate 1 around at the center of the thereof while rotating the substrate 1 about the vertical rotation axis, thereby to apply the first mixture 26 across the top surface 1*a* of the substrate 1.

The step for coating the first mixture 26 and the step for drying the formed coated film 28*a* should be implemented at least once, but may be repeated multiple times. Repeating those steps multiple times allows the coated film 28*a* growing thicker. When the spray-coating process is combined with the spin-coating process, it is preferable to repeat the step for spray-coating the first mixture 26 and the step for drying the formed coated film 28*a* multiple times, and then to achieve the step for spin-coating the first mixture 26 and the step for drying the formed coated film 28*a*. If necessary, the step for spin-coating the first mixture 26 and the step for drying the formed coated film 28*a* in the spin-coating process may be repeated multiple times as well. Also, when the spray-coating process is combined with the spin-coating process, the first mixture 26 may be spin-coated on the substrate 1 after being spray-coated (spray-coating step), and a second mixture containing a second resin and a second solvent may be spin-coated (spin-coating step). The coated film (the first coated film) formed in the spray-coating step is preferably dried in a first drying step. The coated film of the first mixture formed in the spin-coating step and the coated film (the second coated film) of the second mixture are both preferably dried. In the present disclosure, the step for drying the second coated film may be referred to as the second drying step. The protective film 28, which is obtained by drying the second coated film formed on the first coated film by the spin-coating steps, contains the second resin as well as the first resin. However, the second coated film may have constituents which are the same as or different from ones of the first coated film. The viscosity and/or the constituents of the mixtures used in each of the coating processes may be adjusted appropriately.

The water-soluble first resin may include, for example, polyvinyl acetate or a saponified product thereof (such as partially saponified product of polyvinyl acetate and polyvinyl alcohol), polyacrylic acid, polymethacrylic acid, polyacrylamide, poly-2-acrylamido-2-methylpropanesulfonic acid, polyvinyl pyrrolidone, polystyrene sulfonic acid, polyethylene oxide, a water-soluble polyester, a water-soluble oxazole based polymer (such as oxazol-2-ethyl-4,5-dihydro-homopolymer) and a salt thereof (such as alkali metal salt and ammonium salt). The first resin may be used alone or in combination with two or more of them. Among others, water-soluble polyester and water-soluble oxazole-based polymer are preferably used because they are readily diluted with the organic solvent, and various kinds of the first organic solvents may be available for the first resin.

The first mixture 26 contains the organic solvent (first organic solvent) having the vapor pressure higher than that of water. The vapor pressure of the first organic solvent at 25 degrees C. may be higher than 3.1 kPa of water, preferably 5 kPa or greater, and more preferably 10 kPa or greater or 20 kPa or greater, in order to suppress flowing the coated film 28a on the substrate 1.

To facilitate formation of the thinner coated film 28a (or the dried protective film 28) along the convex and concave portions above the top side 1a of the substrate 1, the first organic solvent preferably has a relatively low viscosity at 20 degrees C. of preferably 1.5 mPa·s or less, more preferably 1.3 mPa·s or less, furthermore preferably lower than that of water (for example, less than 1 mPa·s or less, or 0.5 mPa·s or less).

The first organic solvent is preferably a water-soluble organic solvent because of its high affinity to the first resin. The first mixture 26 may further contain water. When the water-soluble organic solvent is used as the first organic solvent, even if the first mixture 26 contains water, it is unlikely subjected to a phase separation, which allows forming the coated film 28a in a uniform manner.

Some examples of the first organic solvent include methanol, ethanol, acetone, ethyl-methyl-ketone, acetonitrile, and dimethylacetamide. The first organic solvent may be used alone or in combination of two or more.

Any combination of the first resin and the first organic solvent may be selected so that the first resin is dissolved in the first mixture at room temperature (25 degrees C.). For example, when the first resin containing polyvinyl alcohol is used, the first organic solvent containing ethanol is preferably used. When the first resin containing the water-soluble oxazole-based polymer is used, the first organic solvent containing ethanol and/or acetone is preferably applied. When the first resin containing the water-soluble polyester is used, the first organic solvent containing acetone is preferably used.

Furthermore, it should be noted that the dissolution condition of the first resin in the first mixture may be varied in accordance with the content of the first resin in the first mixture, the content of the first organic solvent in the first mixture, and/or the content of water in the first mixture if any. Thus, the contents of the first resin, the first organic solvent and/or the water may be adjusted so that the first resin is kept dissolved in the first mixture at room temperature (25 degrees C.).

The first mixture 26 may further contain another organic solvent (second organic solvent) other than the first organic solvent. Although only the first organic solvent may be used as the solvent, the first organic solvent is preferably used in combination with water. The ratio of the first organic solvent to the solvent in the first mixture may be determined, for example, in accordance with the type of the first resin, the kind of the first organic solvent, and the composition of the first mixture.

The water-soluble resin or a poorly water-soluble resin may be used as the second resin in the second mixture which is to be spin-coated. Although not specifically limited thereto, the water-soluble resin may be selected from a group of the ingredients as described above for the first resin. The poorly water-soluble resin may be a resist (resist material) such as a photoresist.

The solvent in the second mixture may include, for example, water, an organic solvent, and a mixed solvent thereof. When the second resin contains a water-soluble resin, it is preferable to use at least water as the solvent, and water and an organic solvent may be used in combination. When the poorly water-soluble resin is used as the second resin, it is preferable that the solvent contains at least the organic solvent. As long as the second resin is soluble in the solvent, any kinds of solvents may be used, and it may be selected in accordance with the type of the second resin and the concentration thereof in the second mixture. The water-soluble resin may be selected from a group of the ingredients as described above for the first resin. The solvent in the second mixture may be the same as or different from that of the first organic solvent. The second resin and the second organic solvent in the second mixture may both be the same as the first resin and the first organic solvent in the first mixture, either one of them may be the same, or both of them may be different from the first resin and the first organic solvent.

Each of the first mixture 26 and the second mixture may further contain an additive, if necessary. For example, when the first mixture 26 or the second mixture contains an anticorrosive agent, the electrodes are advantageously prevented from being corroded due to water. The anticorrosive agent may include, for example, phosphate, amine salts, and lower fatty acids. One or more in combination of the anticorrosive agent may be used.

The coated films 28a formed by applying the first mixture 26 and the second mixture are each dried. The protective film 28 is formed by drying the coated film 28a of the first mixture (and optionally the coated film 28a of the second mixture). When the protective film 28 is formed by the spray-coating step and the spin-coating step, for example, the protective film 28 may be formed by spray-applying and drying the coated film, and then by spin-coating and drying the coated film thereon.

The coated film 28a may be dried with heat, but preferably at a temperature lower than the heatproof temperature of the holding sheet 3, not greater than 50 degrees C., for example, and more preferably lower than 50 degrees C. or less (e.g., lower than 40 degrees C. or less). Also, the coated film 28a may be dried under a reduced pressure. Since the first mixture 26 contains the first organic solvent, the coated film 28a may be dried under such a reduced temperature and pressure. Furthermore, coating the first mixture allows formation of the more uniform coated film 28a which covers across the uneven surfaces of the bumps 32 and the insulative protecting layer 31, and then coating the second mixture allows formation of the protective layer along the asperity of the surface, which eventually suppresses formation of the voids. According to the present embodiment, since the solvent in the protecting layer 28 is substantially removed, the mask burning and the mask deformation otherwise appeared in the laser grooving step and/or the individualizing (or dicing) step are substantially prevented.

The thickness of the protective film 28 formed by the protective-film forming step of the present embodiment can be adjusted, for example, in accordance with the asperity above the surface 1a of the substrate 1 and the plasma-etching conditions in the dicing step. In particular, the protective film 28 preferably has a thickness which is greater at the peripheral portion of the substrate 1 than that at the inside or central portion thereof. In the dicing step, due to the micro-loading effect, the etching rate of the mask may be greater at the peripheral portion of the substrate 1 than at the inside or central portion thereof. Even in such a case, since the protective film 28 is thicker at the peripheral portion than at the inside or central portion thereof, the peripheral portion of the substrate 1 that is more likely etched can be protected from the plasma atmosphere. This facilitates suppressing the residues and the particles generated in the plasma-etching step. The spray-coating apparatus can readily adjust the thickness of the protective film 28 among the peripheral portion and the central portion. Furthermore, the protective film 28 in the dicing regions R2 is removed by the laser grooving step, and it can readily be removed, even if it is formed thicker at the peripheral portion. In the present disclosure, the peripheral portion is defined as an area having a radial distance of 80% or more of the maximum radius from the center of the substrate 1.

Figure 6:
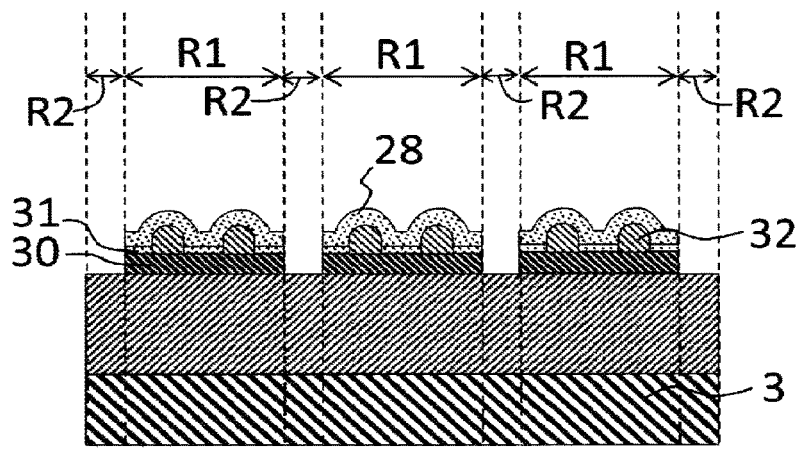
FIG. 6 is a schematic cross-sectional view similar to FIG. 5A illustrating a laser grooving step.

(d) Laser Grooving Step: FIG. 6 is a schematic cross-sectional view illustrating a laser grooving step. In the laser grooving step, a laser beam is irradiated onto the protective film 28 covering the dicing region R2 of the substrate 1 to remove the protective film 28, thereby to expose the top side 1a of the substrate 1 along the dicing regions R2. Even if the multi-stacked wiring layer 30 and the insulative protecting layer 31 for protection thereof are arranged below the protective film 28 covering the dicing regions R2 of the substrate 1, the multi-stacked wiring layer 30 and the insulative protecting layer 31 are removed by irradiation of the laser beam thereby to expose the top side 1a of the substrate 1 along the dicing regions R2 thereof. This forms a predetermined pattern of the remaining protective film 28. The wiring layers 30A of the multi-stacked wiring layer 30 and the metal layers 30D may be formed across the element regions R1 and dicing regions R2 as illustrated in FIG. 3, and the multi-stacked wiring layer 30 is laser-scribed or laser-grooved along the dicing regions R2 so that the wiring layers 30A and the metal layers 30D are both removed along the dicing regions R2.

The laser grooving step may be achieved as described below, using a laser beam source such as a nanosecond pulsed laser irradiating the laser beam of UV wavelength (e.g., 355 nm). The laser beam is irradiated onto the protective film 28 along the dicing regions R2 to remove it. Although the irradiation conditions of the laser beam are not limited thereto, the laser beam may be irradiated at a pulse period of 40 kHz, an output of 0.3 W, and a scan speed of 200 mm/s, for example.

When the multi-stacked wiring layer 30 is arranged below the protective film 28 in the dicing regions R2 of the substrate 1, the laser grooving step may be achieved as described below. The laser beam source such as a nanosecond pulsed laser is used for irradiating the laser beam of a UV wavelength (e.g., 355 nm). The protective film 28 is removed by irradiating the laser beam onto and along the dicing regions twice, at the pulse period of 40 kHz, the output of 0.3 W, and the scan speed of 200 mm/s. Then, the multi-stacked wiring layer 30 is removed by irradiating the laser beam thereon once, at the pulse period of 25 kHz, the output of 1.7 W, and the scan speed of 100 mm/s. Radiation of the laser beam with the relative low output twice for removing the protective film 28 substantially prevents it from being peeled off or delaminated from the substrate 1. On the other hand, radiation of the laser beam with the relative high output for removing the multi-stacked wiring layer 30 allows removing it even if the multi-stacked wiring layer 30 includes the TEG containing cupper (Cu). It is preferable to maintain the temperature of the substrate 1 and the holding tape 3 at 50 degrees or less during the laser grooving step.

Figure 7:
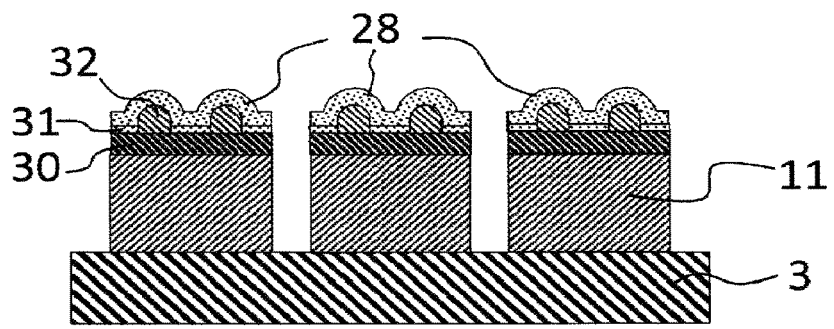
FIG. 7 is a schematic cross-sectional view of element chips individualized or diced in a dicing step.

(e) Dicing or Individualizing Step (Plasma-Etching Step): FIG. 7 is a schematic cross-sectional view of the element chips individualized or diced in a dicing step. After the top side 1a of the substrate 1 exposed along the dicing regions R2 in the laser grooving step as shown in FIG. 6, the substrate 1 is plasma-etched along the dicing regions R2 from the top side 1a through the bottom side 1b thereof in the dicing step as depicted in FIG. 7, thereby to dice or individualize the substrate 1 into a plurality of the element chips 11 corresponding to the dicing regions R2. In the dicing step, the patterned protective film 28 is used as a mask for achieve plasma-etching the substrate 1 in a selective manner.

Figure 9:
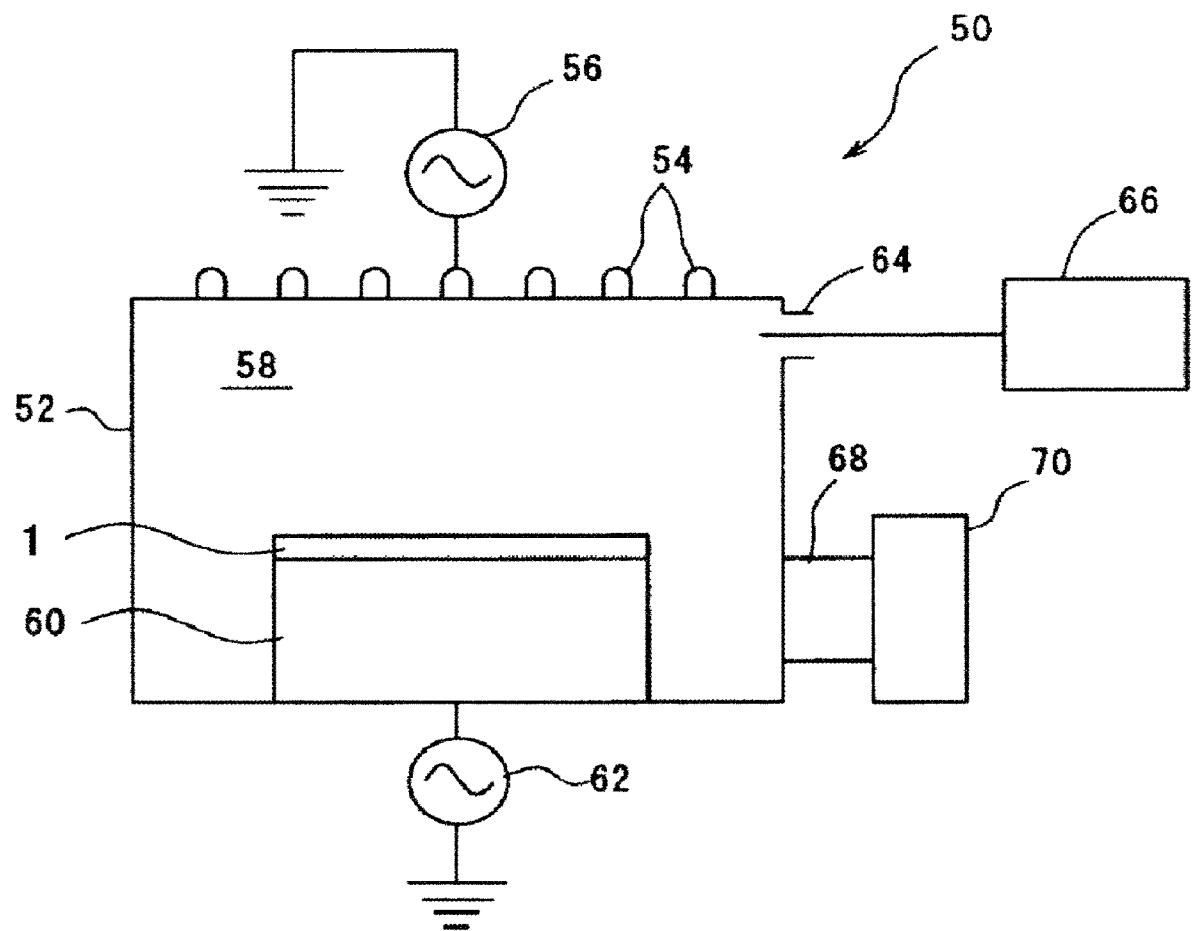
FIG. 9 is a schematic view illustrating an exemplary dry-etching apparatus.

An example of the plasma-etching step and a dry-etching apparatus used for the plasma etching step will be described below. FIG. 9 is a schematic view illustrating an exemplary dry-etching apparatus 50 used in the dicing step. The dry-etching apparatus 50 includes a housing chamber 52, a plurality of dielectric windows (not shown) provided at the top thereof, and antennas 54 as upper electrodes arranged above the dielectric windows. The antennas 54 are electrically connected to a first high-frequency power source 56. On the other hand, arranged below the bottom of the chamber housing 52 is a stage 60 on which the conveying carrier 4 with the substrate 1 adhered thereon is seated. The stage 60 contains a coolant channel (not shown) formed inside thereof, for circulating the coolant to cool the stage 60. The stage 60 also performs a function of a lower electrode which is electrically connected to a second high-frequency power source 62. Although not illustrated in detail, the stage 60 includes an electrostatic chuck (ESC) electrode for electrostatically chucking or suctioning the substrate 1 onto the conveying carrier 4 set on the stage 60. Furthermore, the stage 60 is provided with a cooling gas hole (not shown) for introducing a coolant gas such as helium to cool the substrate 1 electrostatically seated on the stage 60 by circulating the coolant gas therethrough. The chamber housing 52 has a gas inlet 64 fluidly connected to an etching-gas source 66 and a gas outlet 68 fluidly connected to a vacuum exhaust 70 containing a vacuum pump for evacuating the gas inside the chamber 52.

After the conveying carrier 4 (and the substrate 1) is seated on the stage within the chamber housing 52, the chamber housing 52 is decompressed by means of the vacuum pump, and a predetermined processing gas is introduced into the chamber housing 52. Then, the antenna of the dry-etching apparatus (a plasma generator) are supplied with the high-frequency power to generate the plasma atmosphere of the processing gas, in which the substrate 1 is dry-etched along the dicing regions R2 thereof and is diced into a plurality of the element chips 11 each having the element region R1 as illustrated in FIG. 7.

The dry-etching apparatus also includes a controller which controls the processing gas source 66 (etching-gas source), the ashing gas source, the vacuum pump, and the high-frequency power source in order to perform the plasma-etching step under the optimized dry-etching condition.

In the plasma-etching step, when the semiconductor layer 1 is made of silicon, the Bosch process may be used to etch the semiconductor layer along the dicing regions R2. The Bosch process generates alternately a first plasma atmosphere for depositing a passivation film and a second plasma atmosphere for etching the silicon substrate. The first plasma atmosphere for depositing the passivation film may be generated for a given time of approximately 5-20 seconds with the process chamber 58 by supplying the antennas 54 with the RF power of 2000-5000 W while supplying the source gas of $C_4H_8$ at a rate of 300 sccm to have the pressure controlled between 20 Pa. The second plasma atmosphere for etching the silicon substrate may be generated for a given time of approximately 5-20 seconds with the process chamber 58 by supplying the antennas 54 (upper electrodes) with the RF power of 2000-5000 W and supplying the lower electrode with the LF power of 50-500 W, while supplying the source gas of $SF_6$ at a rate of 600 sccm to have the pressure controlled between 20 Pa. In addition, in order to suppress a notching in shape of the processed substrate 1 (semiconductor layer), the lower electrode may be supplied with the pulsed or intermittent RF power. The first plasma atmosphere for depositing the passivation film and the second plasma atmosphere for etching the silicon substrate 1 may be repeated approximately twenty times to plasma-etch the silicon substrate 1 having a thickness of 100 μm, thereby to dice the substrate 1 into the element chips 11. In the plasma-etching step, the conveying carrier 4 and the substrate 1 are preferably cooled down in order to reduce a thermal damage to the substrate 1 due to the plasma atmosphere generated in the plasma-etching step. To cool down the conveying carrier 4 and the substrate 1, for example, the temperature of the stage 60 is adjusted to 20 degrees C. or less, while a DC voltage of 3 kV is applied to the ESC electrode and a helium gas having a pressure of 50-200 Pa is supplied as a cooling gas between the holding tape 3 and the stage 60. When the substrate 1 has a thickness not greater than a predetermined value (e.g., 30 μm or less), the silicon substrate 1 may continuously be etched without adapting the Bosch process.

Some molten debris of metal, insulating material, and silicon, which were contained in the multi-stacked wiring layer 30, the insulative protecting layer 31, and the protective film 28, may be adhered on the top side 1a of the substrate 1 exposed in the laser grooving step along the dicing regions R2. The silicon substrate 1 is plasma-etched by the Bosch process with the debris adhered thereon, which may cause a columnar residue remain, the etching process cease, and/or the surface of the mask roughen. As such, preferably an initial plasma-etching step under a high ionic condition is implemented prior to the Bosch process for plasma-etching the silicon substrate 1 to remove the debris adhered thereon in the dicing regions R2. This eliminates the columnar residue and the cessation of the etching process otherwise caused, and improves the processed or etched configuration of the grooves and the process reliability. The plasma atmosphere for removing the debris is preferably generated with a gas source suitable for reacting with the silicon layer and the silicon oxide layer. For example, the plasma atmosphere may be realized by introducing into the process chamber 58, a mixed gas of $SF_6$ and $O_2$ at 200 sccm to have the chamber pressure of 5 Pa and by supplying the antennas 54 with the RF power of 1000-2000 W, to which the substrate 1 is exposed for approximately one or two minutes. In addition, the lower electrode provided within the stage 60 may be supplied with the LF power of approximately 150 W so that the debris is removed in a further efficient manner.

Figure 8:
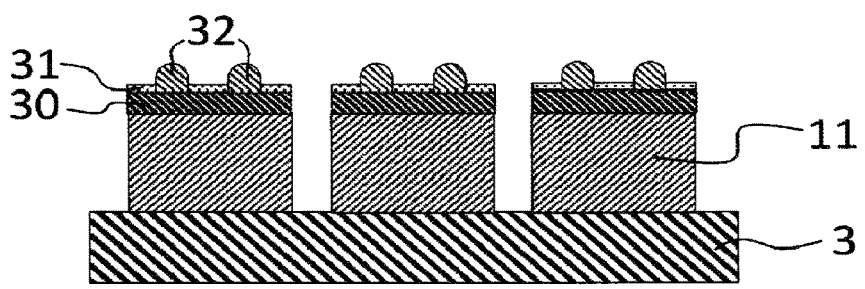
FIG. 8 is a schematic cross-sectional view of the element chips with the protecting layer removed.

(f) Protective-Film Removing Step: FIG. 8 is a schematic cross-sectional view of the element chips with the protective film 28 removed. In the protective-film removing step, the protective film 28 covering the element regions R1 corresponding to the diced element chips 11 is removed. The protective film 28 on each of the element chips 11 as depicted in FIG. 7 are cleaned up with an aqueous rinse solution by contacting it with the protective film 28.

The aqueous rinse solution may be water or a mixture containing water and organic solvent. The organic solvent may be one of which are described above for the first organic solvent. The aqueous rinse solution may contain any additives, if necessary. For example, the additives may include acids, surfactants, anticorrosive agents.

While the aqueous rinse solution is simply to be contacted with the protective film 28, it may be sprayed for removing the protective film 28 in a more efficient manner.

In the protective-film removing step, the protective film 28 may be exposed to a plasma atmosphere containing oxygen plasma for partially removing or ashing it, before the aqueous rinse solution is contacted with the protective film 28. While the plasma-etching step may alter or harden the constituents on the top surface of the protective film 28, the ashing step of the protective film 28 allows removing such altered or hardened portions thereby to facilitate cleaning up the protective film 28 with the aqueous rinse solution.

The ashing step may subsequently be performed within the same chamber as one for plasma-etching the substrate 1 in the dicing step. In the ashing step, an ashing gas such as an oxygen gas is introduced into the process chamber 58 and the high-frequency power is supplied with the antennas 54 (plasma generator) so that the plasma atmosphere of the ashing gas is generated to remove the protective film 28 from the surface of the insulative protecting layer 31 and the bump 32 of the element chip 11.

In the ashing step, the process chamber 58 is evacuated by the vacuum evacuate 70 and supplied with the etching gas containing, for example, oxygen gas from the etching gas source 66, as depicted in FIG. 9. Then, the pressure within the process chamber 58 is maintained at a predetermined value, and the high-frequency power is supplied with the antennas from the first high-frequency power source 56, so that the plasma atmosphere is generated within the process chamber 58 to expose the substrate 1 thereto. Thus, the protective film 28 is partially removed (light ashing) due to a physicochemical action of radicals and ions in the plasma atmosphere, which ensures cleaning up the protective film 28 with the aforementioned aqueous rinse solution.

Also, in the light ashing step, a reactive gas such as a methane ($CH_4$) gas is preferably added in the ashing gas containing the oxygen gas to improve the removal effect of the silicon (Si) layer, the silicon oxide (SiOx) layer, and the hardened mask layer so as to remove the residual film and debris of the protective film 28 and debris. Furthermore, the plasma-etching step is preferably achieved under a higher ionic condition (or a higher sputtering effect) with the higher biased potential, thereby to improve the removal effect of the metal constituents. As such, the plasma atmosphere in the light ashing step is generated with the gas suitable for removing the altered or hardened portions on the top surface of the resist layer, and for example, may be realized by introducing into the chamber, a mixed gas of $O_2$ and $CH_4$ at 300 sccm to have the chamber pressure of 1 Pa and by supplying the antennas 54 with the RF power of 2000-5000 W, to which the substrate 1 is exposed for approximately one to three minutes. In addition, the lower electrode provided within the stage 60 may be supplied with the LF power of approximately 100 W so that the debris is removed in a further efficient manner.

REFERENCE NUMERALS

1: substrate, 1a: first side (top side), 1b: second side (bottom side), R1: element region, R2: dicing region, 2: frame, 2a: opening, 2b: notch, 2c: corner cut, 3: holding sheet, 3a: adhesive side, 3b: non-adhesive side, 4: conveying carrier, 11: element chip, 20: nozzle, 26: first mixture, 28a: coated film (undried), 28: protective film (dried), 30: multi-stacked wiring layer, 30A: wiring layer, 30B: insulating layer, 30C: transistor element, 30D: metal layer, 31: protecting layer, 32: bump, 32A: UBM layer, 50: dry-etching apparatus, 52: chamber housing, 54: antenna, 56: first high-frequency power source, 58: process chamber, 60: stage, 62: second high-frequency power source, 64: gas inlet, 66: etching gas source, 68: gas outlet, 70: vacuum evacuate

What is claimed is:

1. A manufacturing process of an element chip, comprising:
    a preparing step for preparing a substrate having first and second sides opposed to each other, and including a plurality of dicing regions and element regions defined by the dicing regions, each of the element regions containing a plurality of convex and concave portions formed above the first side of the substrate;
    a holding step for holding the substrate and an annular frame surrounding the substrate with a holding sheet adhered on the second side of the substrate;
    a protective-film forming step for forming a protective film by applying a first mixture to form a coated film above the first side of the substrate and by drying the coated film to form the protective film along the convex and concave portions, the first mixture containing a first resin which is water-soluble, water and an organic solvent which is water-soluble and has a vapor pressure higher than water;
    a laser grooving step for removing the protective film along the dicing regions by irradiating a laser beam onto the protective film covering the dicing regions thereby to expose the first side of the substrate in the dicing regions;
    a dicing step for plasma-etching the substrate from the first side through the second side along the dicing regions while maintaining the protective film as a mask in the element regions thereby to dice the substrate into a plurality of element chips; and
    a removing step for removing the protective film in the element regions by contacting the protective film with an aqueous rinse solution.

2. The manufacturing process of the element chip according to claim 1, wherein the organic solvent has a viscosity of 1.3 mPas or less at 20 degrees C.

3. The manufacturing process of the element chip according to claim 1, wherein the first mixture also contains an anticorrosive agent.

4. The manufacturing process of the element chip according to claim 1, wherein in the protective-film forming step, a sub-step for applying the first mixture to form the coated film and a sub-step for drying the coated film are repeated two or more times.

5. The manufacturing process of the element chip according to claim 1,
    wherein the protective-film forming step includes,
    a spray-coating sub-step for spray-coating the first mixture to the first side of the substrate to form a first coated film, and
    a first drying sub-step for drying the first coated film formed in the spray-coating sub-step.

6. The manufacturing process of the element chip according to claim 5,
    wherein the protective-film forming step includes,
    after the first drying sub-step, a spin-coating sub-step for spin-coating a second mixture on the first coated film to form a second coated film, the second mixture containing a second resin and a second solvent, and
    a second drying sub-step for drying the second coated film formed in the spin-coating sub-step thereby to form the protective film containing the first resin and the second resin.

7. The manufacturing process of the element chip according to claim 1, wherein the protective film formed in the protective-film forming step has a thickness greater at a peripheral portion of the substrate than at an inside portion thereof.

8. The manufacturing process of the element chip according to claim 1, wherein the removing step includes a sub-step for partially removing the protective film by exposing a surface of the protective film to a plasma atmosphere containing oxygen before contacting the protective film with the aqueous rinse solution.

9. The manufacturing process of the element chip according to claim 1, wherein the first resin comprises at least one selected from the group consisting of a water-soluble polyester and a water-soluble oxazole-based polymer.

10. A manufacturing process of an element chip, comprising:
    a preparing step for preparing a substrate including a plurality of dicing regions and element regions defined by the dicing regions, each of the element regions containing an asperity thereon;
    a protective-film forming step for forming a protective film by applying a first mixture to the substrate to form a coated film and by drying the coated film to form the protective film, the first mixture containing a first resin which is water-soluble, water and an organic solvent which is water-soluble and has a vapor pressure higher than water;
    a laser grooving step for removing the protective film along the dicing regions by irradiating a laser beam onto the protective film along the dicing regions thereby to expose the substrate;
    a dicing step for plasma-etching the substrate with the protective film used as a mask to dice the substrate into a plurality of element chips; and
    a removing step for removing the protective film with an aqueous rinse solution.

11. The manufacturing process of the element chip according to claim 10, wherein the organic solvent has a viscosity of 1.3 mPas or less at 20 degrees C.

12. The manufacturing process of the element chip according to claim 10, wherein the first mixture also contains an anticorrosive agent.

13. The manufacturing process of the element chip according to claim 10, wherein in the protective-film forming step, a sub-step for applying the first mixture to form the coated film and a sub-step for drying the coated film are repeated two or more times.

14. The manufacturing process of the element chip according to claim 10,
    wherein the protective-film forming step includes,
    a spray-coating sub-step for spray-coating the first mixture to the first side of the substrate to form a first coated film, and
    a first drying sub-step for drying the first coated film formed in the spray-coating sub-step.

15. The manufacturing process of the element chip according to claim 14,
    wherein the protective-film forming step includes,
    after the first drying sub-step, a spin-coating sub-step for spin-coating a second mixture on the first coated film to form a second coated film, the second mixture containing a second resin and a second solvent, and
    a second drying sub-step for drying the second coated film formed in the spin-coating sub-step thereby to form the protective film containing the first resin and the second resin.

16. The manufacturing process of the element chip according to claim 10, wherein the protective film formed in the protective-film forming step has a thickness greater at a peripheral portion of the substrate than at an inside portion thereof.

17. The manufacturing process of the element chip according to claim 10, wherein the removing step includes a sub-step for partially removing the protective film by exposing a surface of the protective film to a plasma atmosphere containing oxygen before contacting the protective film with the aqueous rinse solution.

18. The manufacturing process of the element chip according to claim 10, wherein the first resin comprises at least one selected from the group consisting of a water-soluble polyester and a water-soluble oxazole-based polymer.

\* \* \* \* \*